(12) United States Patent
Kwon et al.

(10) Patent No.: US 8,571,144 B2
(45) Date of Patent: Oct. 29, 2013

(54) DIGITAL BROADCAST TRANSMITTER AND RECEIVER AND METHOD FOR PROCESSING STREAM THEREOF

(75) Inventors: Yong-sik Kwon, Suwon-si (KR); June-hee Lee, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1020 days.

(21) Appl. No.: 12/427,005

(22) Filed: Apr. 21, 2009

(65) Prior Publication Data

US 2009/0274242 A1    Nov. 5, 2009

Related U.S. Application Data

(60) Provisional application No. 61/048,992, filed on Apr. 30, 2008.

(30) Foreign Application Priority Data

Feb. 25, 2009    (KR) .............................. 2009-0015844

(51) Int. Cl.
*H04L 27/06* (2006.01)
*H04L 27/00* (2006.01)

(52) U.S. Cl.
USPC .......................................... 375/340; 375/295

(58) Field of Classification Search
USPC .......................... 375/316, 340–343, 346, 295
See application file for complete search history.

(56) References Cited

U.S. PATENT DOCUMENTS

| | | | |
|---|---|---|---|
| 2007/0121681 A1* | 5/2007 | Kang et al. ..................... | 370/535 |
| 2007/0297544 A1* | 12/2007 | Choi et al. ..................... | 375/346 |
| 2009/0060051 A1* | 3/2009 | Song et al. ............... | 375/240.25 |
| 2010/0231803 A1* | 9/2010 | Citta et al. ..................... | 348/723 |
| 2010/0283918 A1* | 11/2010 | Zhang ........................... | 348/735 |

* cited by examiner

*Primary Examiner* — Shuwang Liu
*Assistant Examiner* — David Huang
(74) *Attorney, Agent, or Firm* — Sughrue Mion, PLLC

(57) ABSTRACT

A digital broadcast receiver is provided. The digital broadcast receiver includes a receiver which receives a transport stream transmitted from a digital broadcast transmitter, an additional data stream detector which determines whether the received transport stream includes an additional data stream or not, and a processor which process the additional data stream if the transport stream include the additional data stream, and the transport stream including the additional data stream is a transport stream into which a training signal is inserted by the digital broadcast transmitter which resets memories used for trellis-encoding at predetermined time. Accordingly, it is easily detected whether the transport stream includes the additional data stream or not.

16 Claims, 20 Drawing Sheets

FIG. 14A

```
Channel_list_initialize;
For ( channel = 0; channel < N; channel++){
        Tuner_setting(channel);
        Wait for Demodulator, E.Q delay;
        get_robust_channel_indicator();
        if ( robust_channel_indicator) adding_channel_list(channel);
}
```

FIG. 14B

```
Channel_list_initialize;
For ( channel = 0; channel < N; channel++){
        Tuner_setting(channel);
        Wait for Demodulator, E.Q delay;
        Wait for Robust FEC Decoding;
        get_robust_channel_indicator();
        if ( robust_channel_indicator) adding_channel_list(channel);
}
```

DIGITAL BROADCAST TRANSMITTER AND RECEIVER AND METHOD FOR PROCESSING STREAM THEREOF

CROSS-REFERENCE TO RELATED APPLICATIONS

This application claims the benefit under 35 U.S.C. §119 from U.S. Provisional Application No. 61/048,992, filed on Apr. 30, 2008, and Korean Patent Application No. 2009-0015844, filed on Feb. 25, 2009 at the Korea Intellectual Property Office, the disclosure of which are incorporated herein by reference in their entireties.

BACKGROUND OF THE INVENTION

1. Field of the Invention

Apparatuses and methods consistent with the present invention relate to a digital broadcast transmitter to process and transmit a transport stream including an additional data stream and a digital broadcast receiver to receive the transport stream, and a method for processing a stream thereof.

2. Description of the Related Art

Thanks to the development of digital technology, a digital processing system such as a digital television has been widely used in the video field. Accordingly, diverse digital broadcast standards have been suggested to transmit digital streams and enable a home to receive and process digital broadcast data.

The digital broadcast provides high quality broadcast and has high transmission efficiency of radio waves, making it possible to transmit and receive a larger amount of information than analog broadcast. However, if the transport streams are broken due to circumferential magnetic field or obstacles, broadcast interruption may occur. This problem occurs more frequently in the case of moving vehicles and portable devices.

Therefore, in order for users to stably watch the digital broadcast in a moving vehicle, the method that uses data streams which have been processed robustly against an error compared to existing data streams has been suggested. However, if strong additional error correction coding is applied to a new transport stream, a long time is taken to detect whether the transport stream includes the strong additional error correction coding or not. Therefore, there is a demand for a method for easily detecting whether a transport stream include an additionally transmitted new stream or not.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

The present invention provides a digital broadcast transmitter, a digital broadcast receiver, and a method for processing a stream thereof, which are capable of easily detecting whether a transport stream received at a receiver includes an additional data stream or not, thereby providing digital broadcast service more efficiently.

Consistent with an aspect of the present invention, a digital broadcast receiver comprises a receiver which receives a transport stream transmitted from a digital broadcast transmitter, an additional data stream detector which determines whether the received transport stream includes an additional data stream or not, and a processor which process the additional data stream if the transport stream include the additional data stream, and the transport stream including the additional data stream is a transport stream into which a training signal is inserted by the digital broadcast transmitter which resets memories used for trellis-encoding at predetermined time.

The additional data stream detector may determine whether the transport stream includes the additional data stream using at least one of a field sync signal of the transport stream and the training signal.

The digital broadcast receiver may further comprises a demodulator which demodulates the received transport stream, and an equalizer which equalizes the transport stream, and the additional data stream detector may determine whether at least one of the demodulated transport stream and the equalized transport stream includes the additional data stream or not.

The additional data stream detector may determine whether the transport stream includes the additional data stream or not according to a property code value of the field sync signal.

The additional data stream detector may determine whether the transport stream includes the additional data stream or not using a correlation value of a PN code inserted into a predetermined symbol of the field sync signal.

The additional data stream detector may determine whether the transport stream includes the additional data stream or not according to whether FEC coding is performed with respect to a predetermined symbol of the field sync signal.

The additional data stream detector may determine whether the transport stream includes the additional data stream or not according to whether the training signal is inserted or not.

The digital broadcast receiver may further comprise a decoder which decodes the equalized transport stream, and the additional data stream detector may determine whether the transport stream includes the additional data stream or not according to whether there is an error in the decoded data or not.

The additional data stream detector may generate a channel indicator if the transport stream is determined to include the additional data stream.

The training signal may be inserted into a data area of the transport stream and may be larger than the field sync signal.

Consistent with an aspect of the present invention, a stream processing method of a digital broadcast receiver comprises receiving a transport stream transmitted from a digital broadcast transmitter, determining whether the received transport stream includes an additional data stream or not, and processing the additional data stream if the transport stream includes the additional data stream, and the transport stream including the additional data stream is a stream into which a training signal is inserted by the digital broadcast transmitter which resets memories used for trellis-encoding at predetermined time.

The determining step may determine whether the transport stream includes the additional data stream or not using at least one of a field sync signal of the transport stream and the training signal.

The stream processing method may further comprise demodulating the received transport stream, and equalizing the transport stream, and the determining step may determine whether at least one of the demodulated transport stream and the equalized transport stream include the additional data stream or not.

The determining step may determine whether the transport stream includes the additional data stream or not according to a property code value of the field sync signal.

The determining step may determine whether the transport stream includes the additional data stream or not using a correlation value of a PN code inserted into a predetermined symbol of the field sync signal.

The determining step may determine whether the transport stream includes the additional data stream or not according to whether FEC coding is performed with respect to a predetermined symbol of the field sync signal.

The determining step may determine whether the transport stream includes the additional data stream or not according to whether the training signal is inserted or not.

The stream processing method may further comprise decoding the equalized transport stream, and the determining step may determine whether the transport stream includes the additional data stream or not according to whether there is an error in the decoded data or not.

The stream processing method may further comprise, if the transport stream is determined to include the additional data stream, generating a channel indicator.

The training signal may be inserted into a data area of the transport stream and may be larger than the field sync signal.

Consistent with another aspect of the present invention, a digital broadcast transmitter comprises a multiplexer unit which generates a transport stream including an additional data stream which is robustly processed so as to be processed by a receiver having mobility, and an exciter unit which perform trellis encoding with respect to the transport stream, resets memories used for the trellis-encoding at predetermined time, and inserts a training signal which is known to the transmitter and the receiver into the transport stream, and the transport stream includes a field sync signal at least one area of which is differently configured according to whether the transport stream includes the additional data stream or not.

The exciter unit may set a different value for a property code of the field sync signal according to whether the transport stream includes the additional data stream or not.

The exciter unit may insert a PN code into a predetermined symbol of the field sync signal according to whether the transport stream includes the additional data stream or not.

The exciter unit may perform FEC coding with respect to a predetermined symbol of the field sync signal according to whether the transport stream includes the additional data stream or not.

The training signal may be inserted into a data area of the transport stream and may be larger than the field sync signal.

The exciter unit may comprise a randomizer which randomizes the transport stream, a training signal inserter which inserts the training signal into the randomized transport stream, a RS encoder which encodes the transport stream into which the training signal is inserted, an interleaver which interleaves the encoded transport stream, a trellis encoder which trellis-encodes the interleaved transport stream, and a sync multiplexer which inserts the field sync signal into the trellis-encoded transport stream.

Consistent with another aspect of the present invention, a stream processing method of a digital broadcast transmitter comprise generating a transport stream including an additional data stream which is robustly processed so as to be processed by a receiver of mobility, and performing trellis encoding with respect to the transport stream, resetting memories used for the trellis encoding at predetermined time, and inserting a training signal which is known to the transmitter and the receiver into the transport stream, and the transport stream includes a field sync signal at least one area of which is differently configured according to whether the transport stream includes the additional data stream or not.

A property code of the field sync signal may be set to have a different value according to whether the transport stream includes the additional data stream or not.

A PN code may be inserted into a predetermined symbol of the field sync signal according to whether the transport stream includes the additional data stream or not.

FEC coding may be performed with respect to a predetermined symbol of the field sync signal according to whether the transport stream includes the additional data stream or not.

The training signal may be inserted into a data area of the transport stream and is larger than the field sync signal.

The stream processing method may further comprise randomizing the transport stream, inserting the training signal into the randomized transport stream, encoding the transport stream into which the training signal is inserted, interleaving the encoded transport stream, trellis-encoding the interleaved transport stream, and inserting the field sync signal into the trellis-encoded transport stream.

Accordingly, the digital broadcast service is more efficiently provided.

Additional and/or other aspects and advantages of the invention will be set forth in part in the description which follows and, in part, will be obvious from the description, or may be learned by practice of the invention.

BRIEF DESCRIPTION OF THE DRAWING FIGURES

The above and/or other aspects of the present invention will be more apparent by describing certain exemplary embodiments of the present invention with reference to the accompanying drawings, in which:

FIGS. 14A and 14B are views of search algorithms consistent with an exemplary embodiment of the present invention;

DETAILED DESCRIPTION OF THE EXEMPLARY EMBODIMENTS

Figure 1:
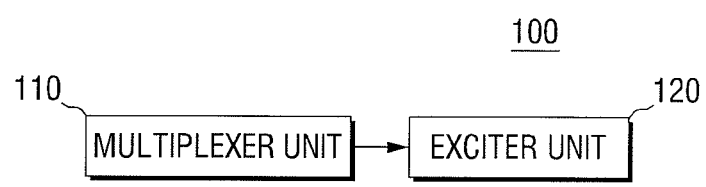
FIG. 1 is a block diagram of a digital broadcast transmitter consistent with an exemplary embodiment of the present invention.

Certain exemplary embodiments of the present invention will now be described in greater detail with reference to the accompanying drawings.

In the following description, same drawing reference numerals are used for the same elements even in different drawings. The matters defined in the description, such as detailed construction and elements, are provided to assist in a comprehensive understanding of the invention. Thus, it is apparent that the exemplary embodiments of the present invention can be carried out without those specifically defined matters. Also, well-known functions or constructions are not described in detail since they would obscure the invention with unnecessary detail.

FIG. 1 is a block diagram of a digital broadcast transmitter according to an exemplary embodiment of the present invention. Referring to FIG. 1, a digital broadcast transmitter 100 comprises a multiplexer unit 110 and an exciter unit 120.

The multiplexer unit 110 generates a transport stream including a normal data stream and an additional data stream. The normal data stream is a data stream that is transmitted from an existing digital broadcast system for broadcast. The additional data stream is a stream that is processed by applying a different coding method or coding rate from that of the normal data stream, and is processed to be robust against error to be suitable for the receiver having mobility.

The multiplexer unit 110 generates the transport stream by formatting the additional data stream in an appropriate form and inserting??? it into the normal data stream.

More specifically, the multiplexer unit 110 alternately inserts at least one additional data stream into each stream unit of normal data, successively, and in a predetermined pattern. The term "stream unit" is used to distinguish the normal data and may be a segment unit or packet unit.

The exciter unit 120 processes the transport stream generated by the multiplexer unit 110 and transmits it through a channel. Also, the exciter unit 120 may perform trellis encoding with respect to the transport stream, reset the memories used for trellis encoding at predetermined time, and insert a training signal which is known to the transmitter and the receiver into the transport stream. Herein, the training signal may be inserted into a data area of the transport stream and may be larger than a field sync signal. For example, the training signal is of a size of 1424 symbols and is inserted at two-segment intervals. Detailed description thereof will be provided below.

Also, the exciter unit 120 may differently configure at least one area of the field sync signal of the transport stream according to whether the transport stream includes the additional data stream or not.

More specifically, the exciter unit 120 may set a different value for the property code in the field sync signal according to whether the transport stream includes the additional data stream or not Also, the exciter unit 120 may determine whether to insert a Pseudo Noise (PN) code into a predetermined symbol of the field sync signal according to whether the transport stream includes the additional data stream or not.

Also, the exciter unit 120 may determine whether to perform forward error correction (FEC) coding with respect to a predetermined symbol of the field sync signal according to whether the transport stream includes the additional data stream or not.

Figure 2:
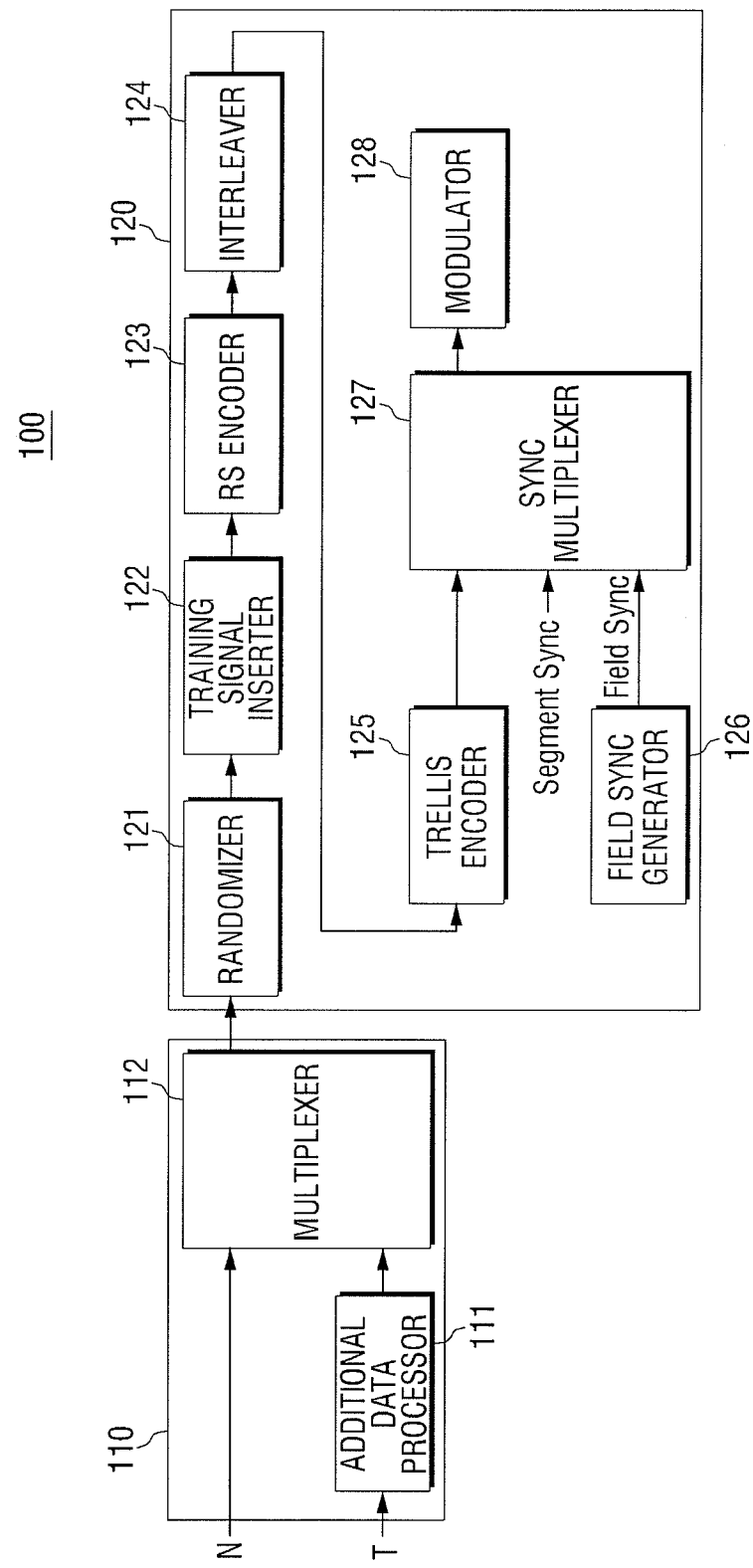
FIG. 2 is a detailed block diagram of an example of the digital broadcast transmitter of FIG. 1.

FIG. 2 is a detailed block diagram of an example of the digital broadcast transmitter of FIG. 1.

An additional data processor 111 for processing an additional data stream T receives at least one data stream, which is to be inserted into a normal data stream N and additionally transmitted, from an inner or external source, and processes the data stream to be robust against an error and transmits the data stream to a multiplexer 112.

The multiplexer 112 inserts the at least one additional data stream T transmitted from the additional data processor 111 into the normal data stream N, thereby generating a transport stream.

The additional data processor 111 may comprise one or several pre-processors (not shown) depending on the number of additional data. The pre-processor (not shown) may comprise a Reed Solomon (RS)-encoder (not shown), an interleaver (not shown), and a packet formatter (not shown). Passing through the RS-encoding, interleaving, and packet formatting processes, the additional data stream becomes robust against an error.

The additional data stream input to the pre-processor (not shown) is encoded by the RS-encoder (not shown) and then interleaved by the interleaver (not shown). The packet formatter (not shown) performs packet formatting with respect to the additional data stream output from the interleaver.

A randomizer 121 randomizes the transport stream.

A training signal inserter 122 inserts a training signal which is known to the transmitter and the receiver into the transport stream. The training signal inserted may be used to determine whether the transport stream received at the receiver includes the additional data stream or not. Also, the training signal is used in demodulation or equalization at the receiver to improve receiving performance. Herein, the training signal is larger than the field sync signal and is inserted at two-segment intervals. That is, the training signal may be a long training symbol, for example, may of 1424 symbols, which is larger than the field sync signal of 832 symbols.

A RS encoder 123 encodes the transport stream into which the training signal is inserted and the interleaver 124 interleaves the encoded transport stream and transmits it to a trellis encoder 125.

The trellis encoder 125 trellis-encodes the interleaved transport stream and transmits it to the sync multiplexer 127.

The trellis encoder 125 may perform trellis-reset at proper time according to whether the training signal is inserted or not. That is, the trellis encoder 125 uses a plurality of internal memories (for example, three shift registers) during the trellis encoding process. Due to the previous values already stored in the internal memories, known data values may change when the trellis encoding is performed with respect to the training signal. In order to prevent the change in the known data value, the trellis reset is performed to reset the internal memories to initial values prior to processing the training signal. Also, in order to prevent an incorrect parity in response to the trellis reset, parity correction may be performed. In this case, a RS re-encoder (not shown) may be further included. Detailed description thereof will be provided below with reference to FIG. 4A.

A field sync generator 126 generates a field sync signal to be inserted into the transport stream. The field sync generator 126 may differently configure at least one area of the field sync signal so that the receiver can determine whether the transport stream includes the additional data stream or not.

More specifically, the field sync generator 126 may set a different value for the property code of the field sync signal according to whether the transport stream includes the additional data stream or not. For example, if the transport stream includes the additional data stream, the property code of the field sync signal is set to '1', and if not, the property code is set to '0'. However, this is merely an example and the set value may change depending on various embodiments. In this case, the receiver can determine whether the transport stream includes the additional data stream or not based on the property code value.

Also, the field sync generator 126 may determine whether to insert a PN code to a predetermined symbol of the field sync signal according to whether the transport stream includes the additional data stream or not. For example, if the transport stream includes the additional data stream, the PN code is inserted into 82 symbols of 104 symbols of a reserved area, except for a property code area (10 symbols) and a precode area (12 symbols). In this case, the receiver can determine whether the transport stream includes the additional data stream or not based on a PN correlation value.

Also, the field sync generator 126 may determine whether to perform FEC coding with respect to a predetermined symbol of the field sync signal according to whether the transport stream includes the additional data stream or not. For example, if the transport stream includes the additional data stream, the field sync generator 126 may perform FEC coding with respect to 77 symbols of 104 symbols of the reserved area, except for the property code area (10 symbols), the precode area (12 symbols), reserved symbols of 5. In this case, the receiver can determine whether the transport stream includes the additional data stream by decoding the transport stream.

The sync multiplexer 127 inserts the field sync signal generated by the field sync generator 126 and a segment sync signal into the trellis encoded transport stream.

A modulator 128 modulates the transport stream which has been processed by the sync multiplexer 127 and transmits it through a channel. More specifically, the transport stream can be converted into a radio frequency (RF) channel band signal through the Vestigial Sideband (VSB) modulation or RF modulation.

The digital broadcast transmitter may further comprise other components in addition to those of FIG. 2. For example, the digital broadcast transmitter may further comprise a pilot inserter (not shown) to add a predetermined DC value and insert a pilot, a pre-equalizer (not shown) to equalize the dual transport stream into which the pilot has been inserted to minimize inter-symbol interference, and a post-processor (not shown) to perform post-processing with respect to the interleaved transport stream.

Also, some of the components shown in FIG. 2 may be omitted and arrangement order thereof may be changed. For example, the randomizer 121 may be omitted if necessary.

Figure 3:
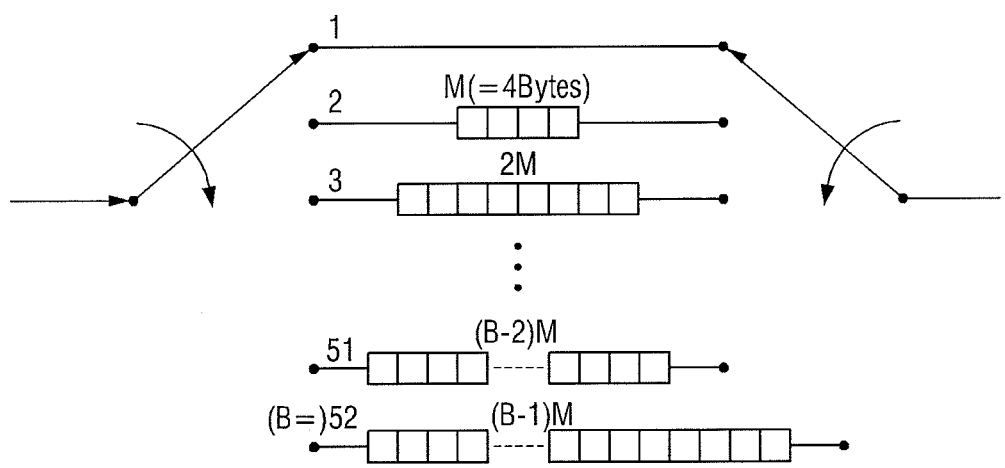
FIG. 3 is a view of an example of the interleaver of FIG. 2.

FIG. 3 is a view of an example of the interleaver 124 of FIG. 2.

Referring to FIG. 3, the interleaver 124 may be a convolution byte interleaver. If a single field is 312 segments, the interleaver 124 may be operated in the unit of 53 data segments.

Referring to FIG. 3, the transport stream output from the RS encoder 123 is divided in the unit of byte, stored to a plurality of shift registers in sequence, and then output to the trellis encoder 125 in sequence. Accordingly, the interleaving is performed in the unit of byte.

Figure 4A:
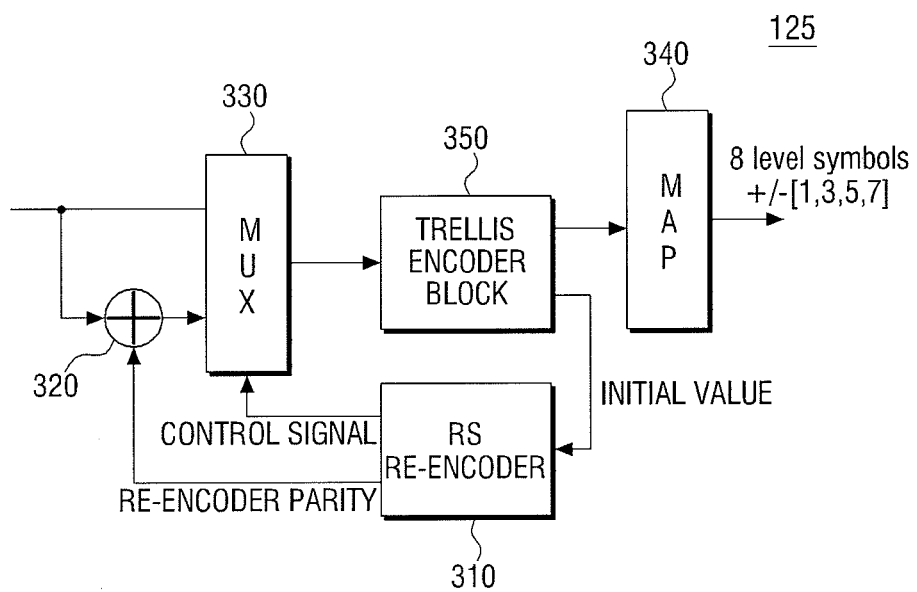
FIGS. 4A and 4B are block diagrams of an example of the trellis encoder of FIG. 2.
Figure 4B:
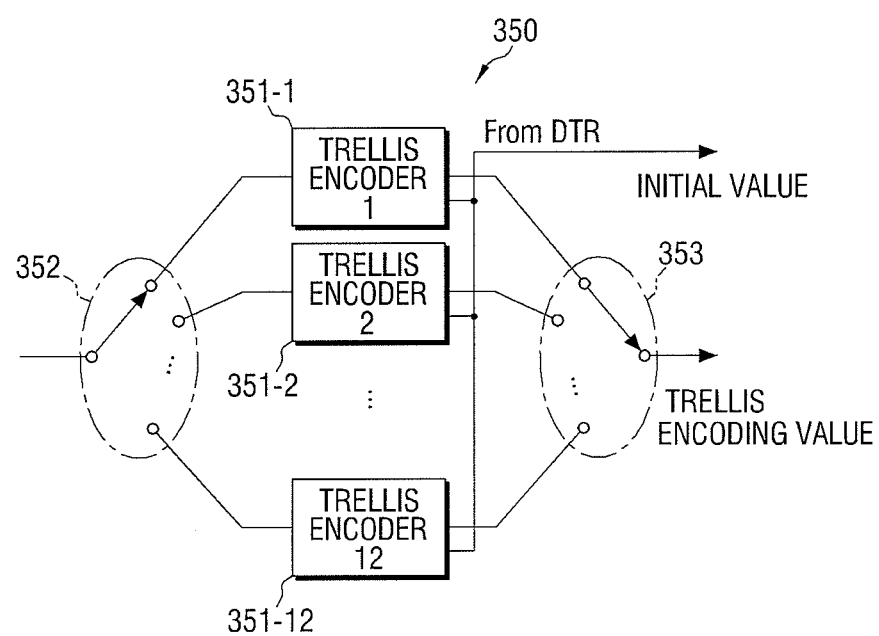

FIGS. 4A and 4B are block diagrams of an example of the trellis encoder 125 of FIG. 2.

Referring to FIG. 4A, the trellis encoder 125 comprises a RS re-encoder 310, an adder 320, a multiplexer 330, a MAP 340, and a trellis encoder block 350.

The multiplexer 330 may be operated in either the mode in which each packet of the incoming transport stream is trellis-encoded (hereinafter, referred to a 'general mode') or the mode in which a packet added by the adder 320 is trellis-encoded (hereinafter, referred to as 'parity correction mode'). The mode of the multiplexer 330 is determined based on the control signal received from the RS re-encoder 310.

In the general mode, the multiplexer 330 transmits the incoming transport stream to the trellis encoder block 350, whereas in the parity correction mode, the multiplexer 330 transmits the stream output from the adder 320 to the trellis encoder block 350.

The trellis encoder block 350 trellis-encodes the packet received from the multiplexer 330. The trellis encoder block 350 may trellis-encode the packet according to an external control signal and may be initialized prior to trellis-encoding the training signal. In order to prevent the training signal from being distorted by the value pre-stored in the memory of the trellis encoder block 350, the trellis encoder block 350 identifies where the training signal is inserted and is initialized prior to trellis-encoding the training signal.

The RS re-encoder 310 re-generates a parity corresponding to the changed packet using an initial value calculated in the initialization by the trellis encoder block 350.

The adder 320 adds the parity re-generated by the RS re-encoder 310 and a packet input from an external source, and transmits the packet to the multiplexer 330. The method for adding is as follows:

The packet A) is . . . 101001010111 001010101011AAAAA . . . ;

The packet B) is . . . 000000000000010000000000 BBBBB . . . ;

The packet C) is . . . 101001010111011010101011 CCCCC . . .

The packet A) is a packet input from an external source, the packet B) is a RS re-encoded packet, and the packet C) is a result of performing exclusive OR with respect to the packet A) and B) using the adder 320. When the underlined part of the packet A) is input to the trellis encoder block 350, initialization is performed. In this case, a value corresponding to a value pre-stored in the trellis encoder block 350 is transmitted to the RS re-encoder 310 such that the RS re-encoder 310 adds a parity to the transmitted value and outputs the packet B). The underlined part of the packet B) means a change value corresponding to the underlined part of the packet A). The parity corresponding to the underlined part of the packet B) is BBBBB, which indicates that the parity is regenerated.

The adder 320 performs exclusive OR with respect to the packets A) and B), thereby outputting the packet C). It can be seen from the packet C) that the underlined part of the initially input packet A) is changed to '01' and the parity is also changed from 'AAAAA' to 'CCCCC'.

The multiplexer 330 is operated in the general mode when the initialization and the parity correction are completed, and transmits the dual transport stream to the trellis encoder block 350.

The MAP 340 symbol-maps the trellis-encoded packet to 8 level and outputs the result of mapping. More specifically, the MAP 340 maps the packets as the following table:

TABLE 1

| Z2 | Z1 | Z0 | R |
|---|---|---|---|
| 0 | 0 | 0 | −7 |
| 0 | 0 | 1 | −5 |
| 0 | 1 | 0 | −3 |
| 0 | 1 | 1 | −1 |
| 1 | 0 | 0 | +1 |
| 1 | 0 | 1 | +3 |
| 1 | 1 | 0 | +5 |
| 1 | 1 | 1 | +7 |

In the table 1, Z0, Z1, Z2 denote trellis encoding values output from the trellis encoder block 350, and R denotes a corresponding mapping output value. That is, if the trellis encoding values are output as 0, 0, 0, the map 340 outputs −7.

FIG. 4B is a block diagram of an example of the trellis encoder block 350 applied to the trellis encoder 125 of FIG. 4A. Referring to FIG. 4B, the trellis encoder block 350 include a plurality of trellis encoders 351-1~351-12, a splitter 352, and an encoding output unit 353.

The splitter 352 outputs streams output from the multiplexer 330 to the plurality of trellis encoders 351-1~351-12 in sequence. In this case, the streams are output in the unit of byte.

Each of the trellis encoders 351-1~351-12 trellis-encodes the incoming stream and output it. In this case, the trellis encoders 351-1~351-12 are selected in sequence and outputs their respective trellis encoding values. During the initialization, the trellis encoders 351-1~351-12 transmit the values pre-stored to their internal memories (not shown) as initial values to the RS re-encoder 310. The RS re-encoder 310 adds a parity to the transmitted initial value and outputs it to the adder 320, thereby correcting the parity.

The encoding output unit 353 detects the encoding values output from the trellis encoders 351-1~351-12 in sequence and output them to the MAP 340.

Each of the trellis encoders 351-1~351-12 has a plurality of memories to perform trellis encoding. In this case, the trellis encoder 351-1~351-12 perform initialization prior to trellis-encoding the area into which an additional reference signal has been inserted. The initialization causes each memory to be reset and the value pre-stored in each memory is transmitted to the RS re-encoder 310 as an initial value.

Each of the trellis encoders 351-1~351-12 may have three memories (first to third memories). If the first memory is initialized, the first memory outputs a previously stored value (hereinafter, referred to as a first initial value) as an initial value. If the third memory is initialized, the third memory shifts a previously stored value to the second memory. The second memory outputs a previously stored value (hereinafter, referred to as a second initial value) as an initial value according to the shift. The RS re-encoder 210 combines the first and the second initial values and uses the combined value as an initial value.

Since the second and the third memories are arranged in parallel to each other to perform the shift operation, a control signal of 2 symbols is required to initialize the second and the third memories. There are 8 types of initial values (000, 111, 001, 010, 100, 110, 101, 011) that can be generated using the three memories. The values X0, X1 meaning the first and the second initial values are transmitted to the RS re-encoder 310 to change the parity.

Figure 5:
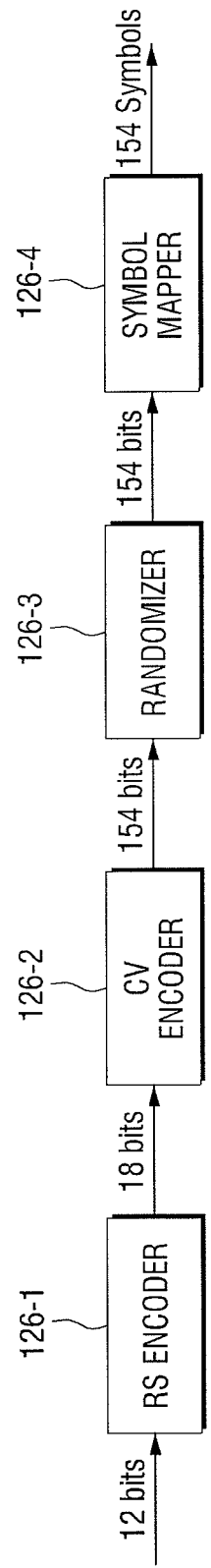
FIG. 5 is a block diagram of an example of the field sync generator of FIG. 2.

FIG. 5 is a block diagram of an example of the field sync generator 126 of FIG. 2.

Referring to FIG. 5, mode information of 12 bits is added with a RS parity when it passes through a RS encoder 126-1.

If the RS (6.4) encoder of GF (8) is used, the mode information becomes 18 bits after the RS encoding. Next, the mode information is convolution-encoded by a CV encoder 126-2. In this case, if ½ rate tail biting convolution coding is performed, the mode information finally becomes 154 bits. That is, if ½ convolution coding is performed after four tail bits are added to the mode information of 18 bits, the mod information becomes 154 bits. The convolution encoding mode information is converted into 154 symbols after passing through a randomizer 126-3 and a symbol mapper 126-4. However, this is merely an example, and some of the components may be omitted or added and their arrangements may be changed.

Figure 6:
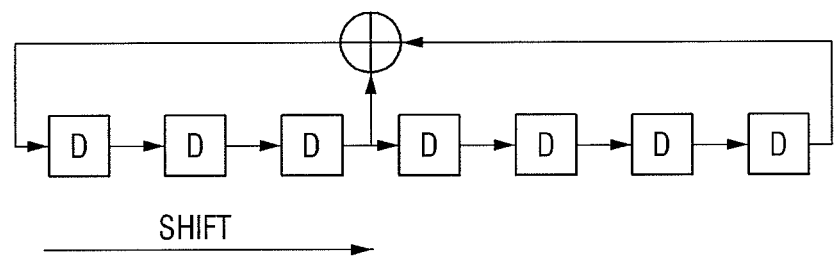
FIG. 6 is a view of the PN sequence generator.

FIG. 6 is a view of an example of a PN sequence generator.

FIG. 6 illustrates a 7 bit PN sequence generator, that is, a PN127 sequence generator. Herein, the initial value is 1001001 for example.

Figure 7:
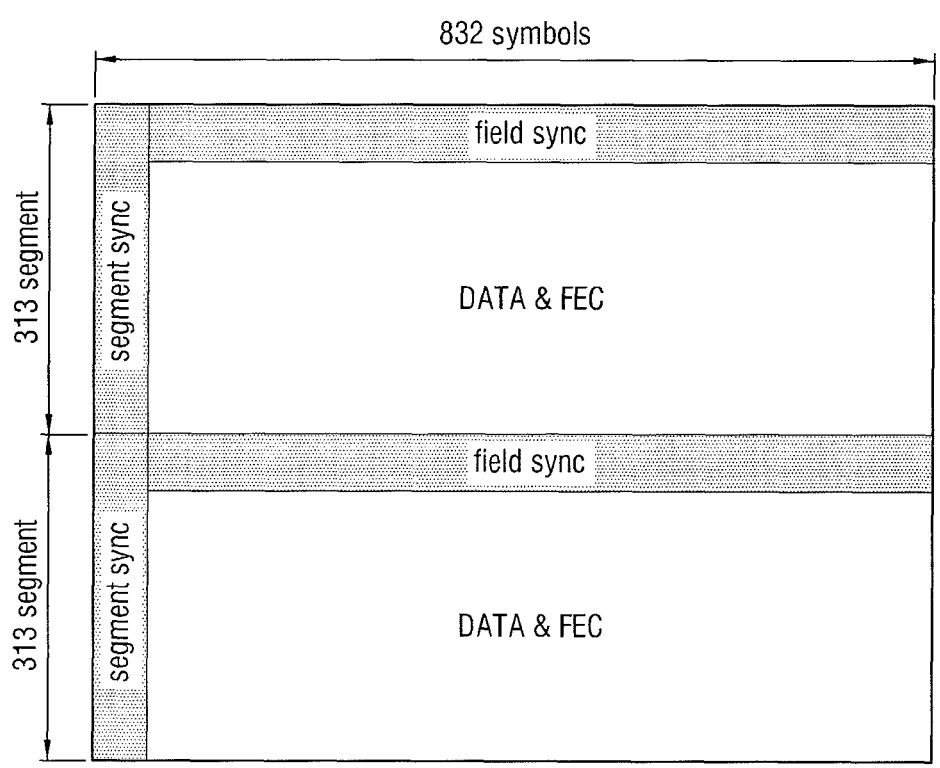
FIG. 7 is a view of the frame of a transport stream transmitted from a digital broadcast transmitter consistent with an exemplary embodiment of the present invention.

FIG. 7 is a view of the frame of the transport stream transmitted from the digital broadcast transmitter according to an exemplary embodiment of the present invention.

Referring to FIG. 7, a single frame consists of 2 fields, each of which consists of 1 field sync segment, which is the first segment, and 312 data segments. The frame is configured by adding one field sync packet into each packet group consisting of 312 packets. One segment, that is, one packet consists of a segment sync signal of 4 symbols and 828 data symbols, thereby having 832 symbols in total.

Figure 8A:
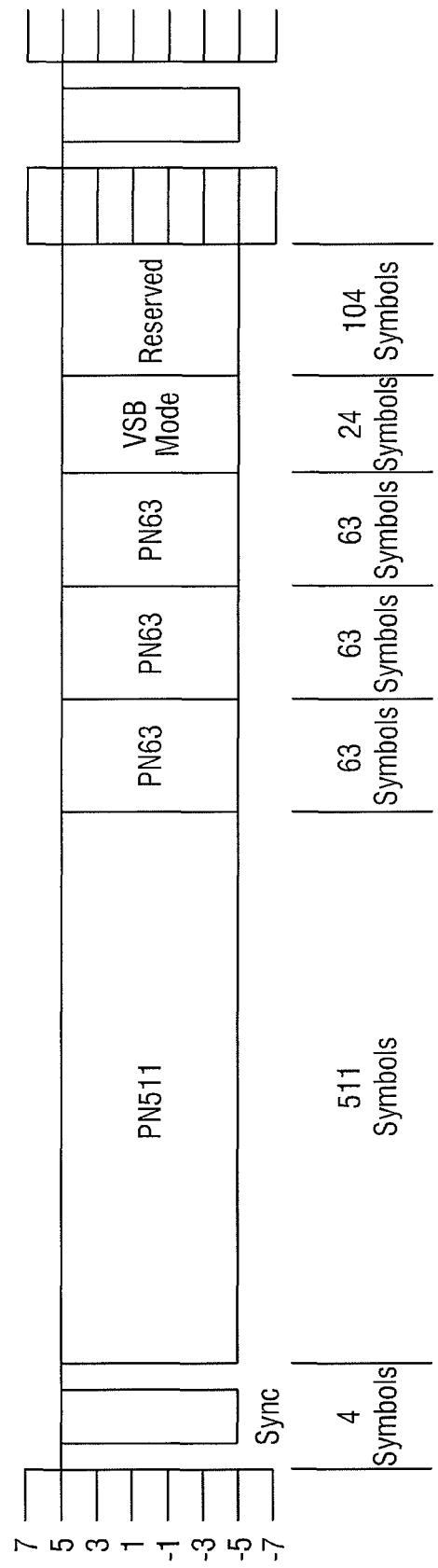
FIGS. 8A and 8B are views of the field sync signal in the frame of the transport stream.
Figure 8B:
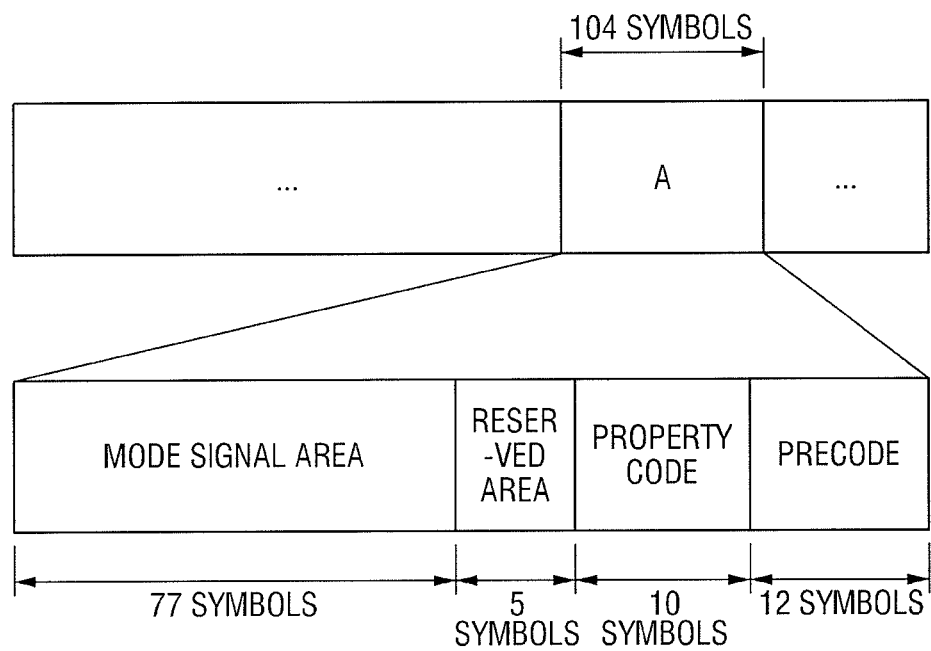

FIGS. 8A and 8B are views provided to explain the field sync signal in the frame of the transport stream.

Referring to FIG. 8A, the field sync signal consists of the segment sync signal of 4 symbols, a pseudo noise sequence (PN sequence) of 511 symbols, three PN sequences each of which has 63 symbols, a transmission mode of 24 symbols, and a reserved area of 104 symbols.

Referring to FIG. 8B, the last 12 symbols of the 104 symbols in the reserved area is used as a precode area and 10 symbols before the precode area are used as a property code area. Herein, the property code (or company code) area may refer to an area where a code indicating property such as version, providing company, and improvement of the additional data is described.

As described above, according to whether the transport stream includes the additional data stream or not, a predetermined signal processing is performed with respect to the 82 symbols of the 104 symbols in the reserved area, except for the property code area (10 symbols) and the precode area (12 symbols).

Figure 9:
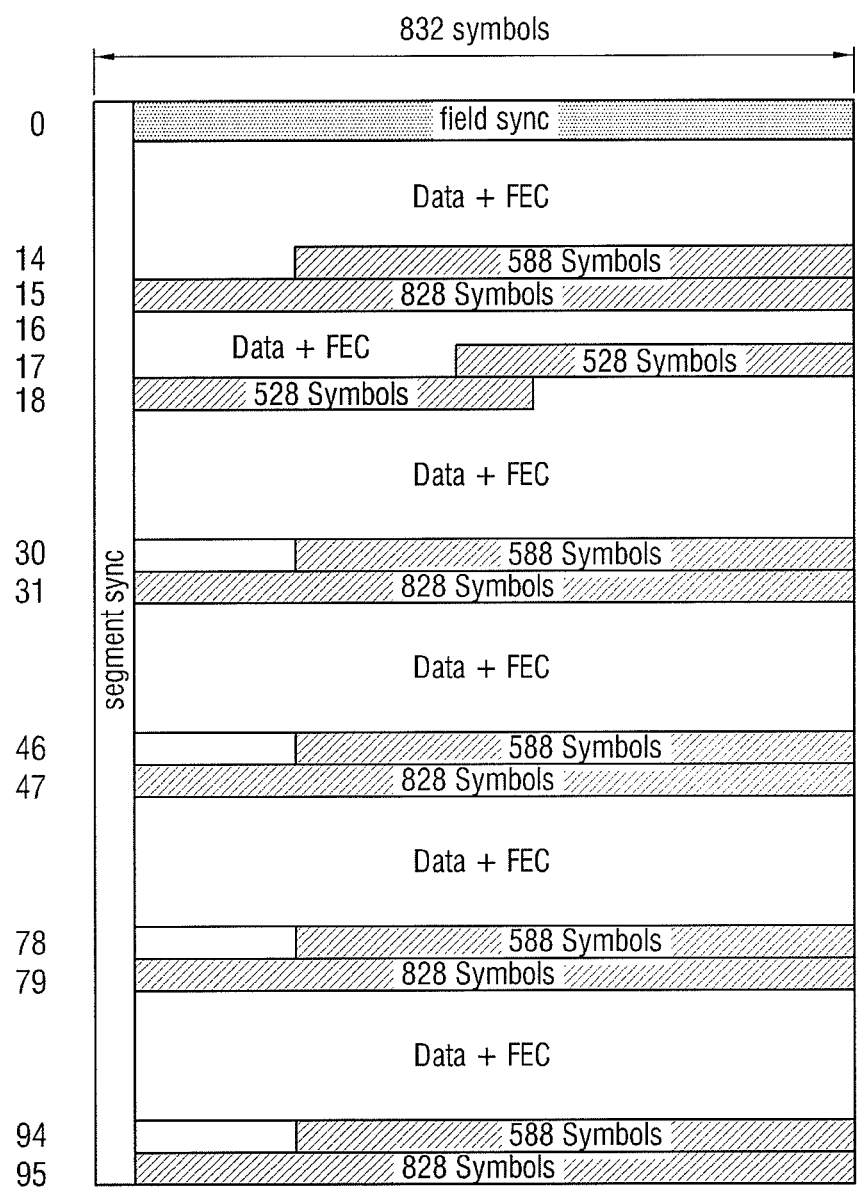
FIG. 9 is a view of the frame of a transport stream into which a training signal is inserted.

FIG. 9 is a view of the frame of the transport stream into which the training signal has been inserted.

As shown in FIG. 9, if one segment is of a size of 832 symbols (4 symbols of them is segment sync signal), the training signal may be of a size greater than 832 symbols, for example, is of a size of 1416 symbols, and may be inserted at two-segment intervals. Also, as shown in FIG. 9, the distance between the long training symbols may be 16 segments. In this case, the receiver determines whether the long training symbol is inserted into the transport stream by referring to the location of the field sync signal.

Figure 10:
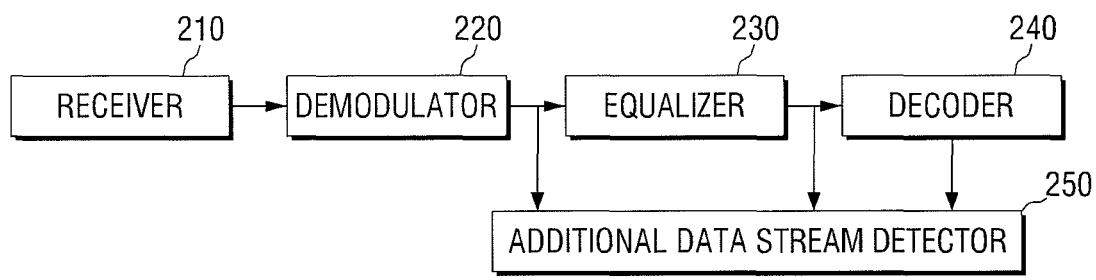
FIG. 10 is a block diagram of a digital broadcast receiver consistent with an exemplary embodiment of the present invention.

FIG. 10 is a block diagram of a digital broadcast receiver according to an exemplary embodiment of the present invention. Referring to FIG. 10, a digital broadcast receiver 200 includes a receiver 210, a demodulator 220, an equalizer 230, a decoder 240, and a channel detector 250.

The digital broadcast receiver 200 may be a portable device which supports digital broadcast service, such as a mobile phone, GPS navigator, MP3 player, PMP player, mobile PC, desktop PC, general DTV.

The receiver 210 receives a transport stream including an additional data stream and may be implemented as a tuner.

The demodulator 220 demodulates the transport stream received through the receiver 210, and the equalizer 230 equalizes the demodulated transport stream.

The decoder 240 decodes at least one additional data stream of the equalized transport stream, thereby recovering the additional data stream. For example, in the case of a plurality of additional data streams, the decoder 240 may decode only some or one of the plurality of additional data streams and discard the remaining additional data streams. Alternatively, the decoder 240 may decode all of the plurality of additional data streams and recover all of them, and also may decode the normal data stream as well as the additional data stream.

The transport stream received by the receiver 210 is the same transport stream as transmitted by the digital broadcast transmitter of FIGS. 1 and 2. That is, the received transport stream may be a stream into which a training signal has been inserted by the digital broadcast transmitter, which resets memories used for trellis encoding at predetermined time. The received transport stream may be a stream which has been properly processed according to whether the transport stream includes an additional data stream or not. For example, according to whether the transport stream includes the additional data stream or not, there may be change in the value of a predetermined area of the field sync signal of the transport stream.

The additional data detector 250 determines the presence or absence of additional data stream using the field sync signal and the training signal inserted into the transport stream.

More specifically, the additional data detector 250 may determine the presence or absence of additional data stream according to the property code value of the field sync signal. For example, the additional data detector 250 determines the presence of additional data stream if the property code area (or company code) of the field sync signal is set to '1'.

Also, the additional data detector 250 may determine the presence or absence of additional data stream using the correlation value of the PN code inserted into a predetermine symbol of the field sync signal. For example, if the transport stream includes an additional data stream, the PN code is inserted into the 82 symbols of the 104 symbols in the reserved area, except for the property code area (10 symbols) and the precode area (12 symbols). Accordingly, if the PN code is inserted, the additional data detector 250 determines that the transport stream includes the additional data stream. In this case, a correlator for detecting a correlation value with respect to a pre-defined reference signal is used to detect whether the PN code is inserted or not.

Also, the additional data detector 250 may determine the presence or absence of additional data stream according to whether FEC coding is performed with respect to a predetermined symbol of the field sync signal. For example, if the transport stream includes an additional data stream, the FEC coding is performed with the 77 symbols of the 104 symbols in the reserved area, except for the property code area (10 symbols), the precode area (12 symbols), and 5 reserved symbols. Accordingly, if the FEC coding is performed, the additional data detector 250 determines that the transport stream includes the additional data stream.

Also, the additional data detector 250 may determine the presence or absence of additional data stream according to whether a long training symbol is inserted into the transport stream or not. For example, if the long training symbol is inserted into the transport stream, it is determined that the transport stream includes the additional data stream.

Also, the additional data detector 250 may determine the presence or absence of additional data stream according to the presence or absence of error in the data decoded by the decoder 240. For example, the additional data detector 250 determines the presence of additional data stream if there is no error in the decoded data.

Also, the additional data detector 250 may generate a channel indicator if it is determined that the transport stream includes the additional data stream.

Although the decoder 240 is illustrated as a single unit in FIG. 9, the decoder 240 may comprise a plurality of decoders (not shown). In this case, each decoder may decode a single additional data stream.

Figure 11:
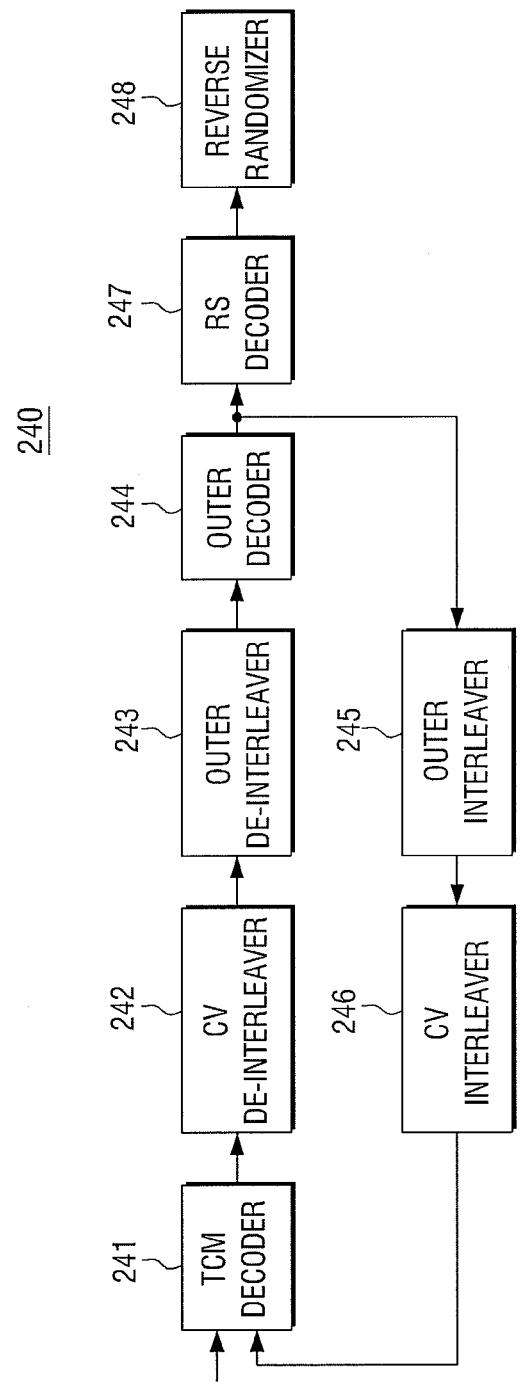
FIG. 11 is a detailed block diagram of an example of the decoder of FIG. 10.

FIG. 11 is a detailed block diagram of an example of the decoder 240 of FIG. 10. Referring to FIG. 11, the decoder 240 comprises a TCM decoder 241, a CV de-interleaver 242, an outer de-interleaver 243, an outer decoder 244, an outer interleaver 245, a CV interleaver 246, a RS decoder 247, and a reverse randomizer 248.

The TCM decoder 241 performs trellis decoding with respect to the additional data stream of the transport stream.

The CV de-interleaver 242 convolution de-interleaves the additional data stream which has been trellis-encoded, and the outer de-interleaver 243 outer-de-interleaves the additional data stream. Then, the outer decoder 244 performs decoding to remove the parity from the additional data stream.

The outer decoder 244 may output a soft decision or hard decision value according to the result of decoding. If a hard decision is made, the additional data stream is output to the RS decoder 247, and if a soft decision is made, the additional data stream output from the outer decoder 244 is transmitted to the outer interleaver 245.

The outer interleaver 245 interleaves the additional data stream and transmits it to the CV interleaver 246. The CV interleaver 246 convolution-interleaves the additional data stream and outputs it to the TCM decoder 241. The trellis decoding operation is repeatedly performed until a hard decision is made, thereby obtaining a reliable decoding value.

According to another exemplary embodiment of the present invention, the outer decoder 244 may be adapted to transmit the soft decision value to the RS decoder 247.

According to still another exemplary embodiment, the hard decision value may be transmitted to the outer interleaver 245 on purpose to reduce hardware complexity.

According to still another exemplary embodiment, the trellis decoding may be repeatedly performed as much as a predetermined number of times without using the hard decision and the soft decision.

The additional data stream after trellis encoding is transmitted to the RS decoder 247. The RS decoder 247 RS-decodes the additional data stream and the reverse randomizer 348 performs reverse randomization, thereby restoring the additional data stream.

Some of the components shown in FIG. 11 may be omitted or a new component may be added. Also, the arrangements of the components may be changed.

The decoder 240 may comprise a normal data decoder (not shown) and an additional data decoder (not shown). In this case, the additional data decoder (not shown) decodes an additional data stream as shown in FIG. 11.

The normal data decoder (not shown) decodes the normal data stream of the transport stream, thereby recovering the normal data. That is, the normal data decoder (not shown)

may comprise a decoder (not shown) such as a Viterbi decoder, a de-interleaver, a RS-decoder, and a reverse randomizer.

As described above, since the decoder 240 comprises both of the normal data decoder and the additional data decoder (not shown), the decoder 240 is able to receive both the normal data service and the additional data service.

Figure 12:
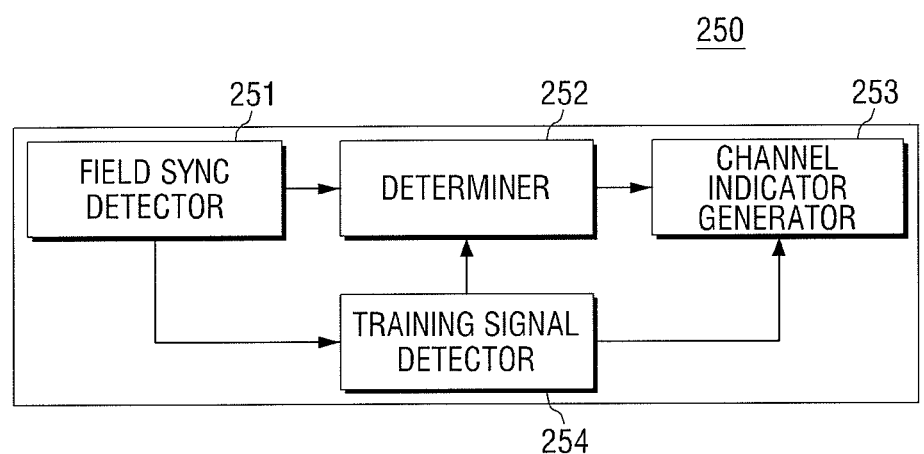
FIG. 12 is a detailed block diagram of an example of the additional data detector of FIG. 10.

FIG. 12 is a detailed block diagram of an example of the additional data detector 250 of FIG. 10. Referring to FIG. 12, the additional data detector 250 may comprise a field sync detector 251, a determiner 252, a channel indicator generator 253, and a training signal detector 254.

The field sync detector 251 detects a field sync signal from the received transport stream. The field sync detector 251 will be described in detail with reference to FIGS. 13A and 13B.

The determiner 252 determines whether the transport stream includes an additional data stream or not using the field sync signal detected by the field sync detector 251.

The training signal detector 254 detects whether a training signal is inserted into the transport stream or not. More specifically, the training signal detector 254 is informed of the location of the field sync signal by the field sync detector 251 and detects the training signal using the location of the field sync signal. For example, if the training signal is inserted into the transport stream as shown in FIG. 9, the training signal detector 254 counts 14 segments from the location of the field sync signal and determines whether the training signal is inserted or not.

If the training signal is detected by the training signal detector 254, the determiner 252 determines that the transport stream includes the additional data stream, and if no training signal is detected, determines that the transport stream does not include the additional data stream.

Also, if there is no error in the decoded data as described above, the determiner 252 may determine that the transport stream includes the additional data stream.

The channel indicator generator 253 may generate a channel indicator if the determiner 252 determines that the transport stream includes the additional data stream.

Figure 13A:
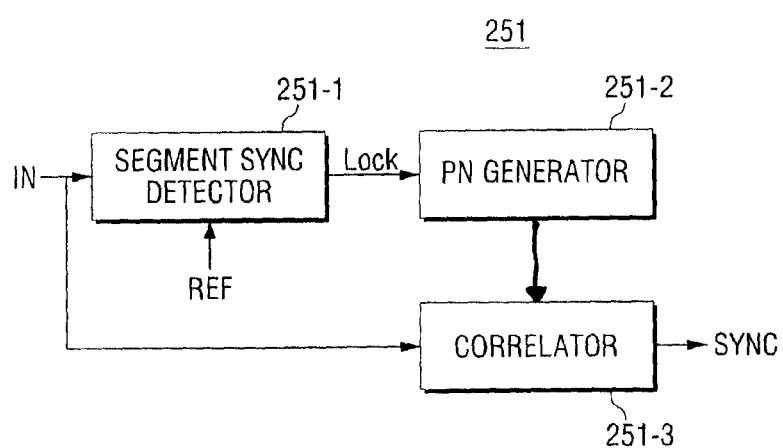
FIGS. 13A and 13B are detailed block diagrams of various examples of the field sync detector of FIG. 10.
Figure 13B:
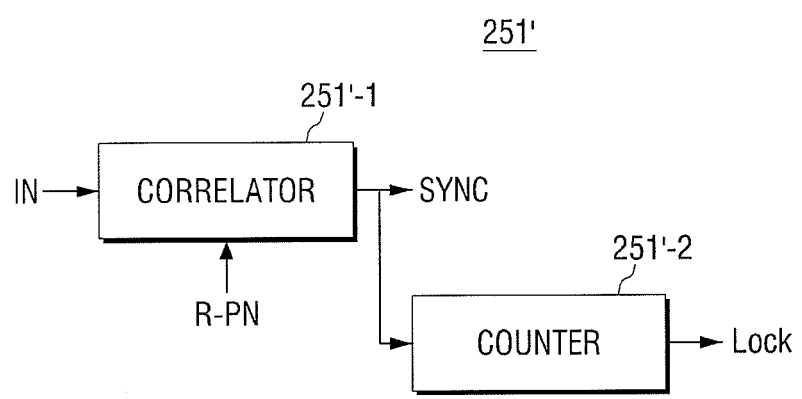

FIGS. 13A and 13B are detailed block diagrams of diverse examples of the field sync detector 251 of FIG. 10. Referring to FIG. 13A, the field sync detector 251 comprises a segment sync detector 251-1, a PN generator 251-2, and a correlator 251-3.

The segment sync detector 251-1 detects a segment sync signal from the transport stream. Detecting the segment sync signal is performed by calculating a correlation value between a reference segment sync signal (REF) pre-set in the receiver and the received transport stream (IN) and selecting the maximum value of the calculated values. Herein, the reference segment sync signal (REF) is prescribed by the transmitter and the receiver and has the same signal pattern as that transmitted from the transmitter.

The PN generator 251-2 generates PN sequences in sequence in response to a detection signal (LOCK) which is generated when the segment sync detector 251-1 detects the segment sync signal, and applies the PN sequences to the correlator 251-3.

The correlator 251-3 calculates correlation values between the PN sequences applied from the PN generator 251-2 in sequence and the digital broadcast signal (IN). The correlator 251-3 calculates the correlation values in the unit of symbol and determines that the field sync signal is generated where the maximum correlation value is calculated, thereby detecting the field sync signal.

FIG. 13B is a block diagram of another example of the field sync detector 251. Referring to FIG. 13B, the field sync detector 251 comprises a correlator 251'-1 and a counter 251'-2.

The correlator 25'-1 calculates a correlation value between the received digital broadcast signal IN and a pre-set reference PN sequence R_PN and determines that the PN is located where the maximum correlation value is calculated, thereby outputting the field sync signal. The correlation value is calculated by multiplying the received digital broadcast signal (IN) by the pre-set reference PN sequence (R_PN) in the unit of predetermined symbol, and adding the results of multiplying in the unit of predetermined symbol. The number of symbols to be multiplied and added depends on the number of symbols for the reference PN sequence (R_PN). For example, if a signal having the same pattern as the PN sequence (PN511) of 511 symbols in the data frame shown in FIG. 7 is set as a reference PN sequence (R_PN) and is applied to the correlator 251'-1, the correlator 251'-1 receives digital broadcast signals (IN) in sequence, and calculates correlation values by multiplying and adding the digital broadcast signals and the reference PN sequence (R_PN) in the unit of 511 symbols every time that the digital broadcast signal is input. Through this process, it is determined that the field sync signal is generated where the maximum correlation value is calculated.

The counter 251'-2 estimates the location of the segment sync signal by referring to the field sync detection signal (SYNC) output from the correlator 251'-1, and then outputs a segment sync detection signal (LOCK). As shown in FIG. 8A, if the field sync segment consists of a segment sync signal of 4 symbols, a first PN sequence of 511 symbols, three second PN sequences, each of which is of a size of 63 symbols, and 128 symbols, and if the reference PN sequence (R_PN) applied to the correlator 251'-1 has the same signal pattern as that of the first PN sequence (PN511), the counter 251'-2 counts the 832 symbols and estimates that the segment sync signal is periodically generated every $317^{th}$ symbol, which is the sum of the second PN sequences of 189 symbols and the remaining 128 symbols, with reference to the field sync detection signal (SYNC). Accordingly, the segment sync detection signal (LOCK) output from the counter 251'-2 is not obtained by calculating the correlation value and is obtained by estimating the location of the segment sync signal with reference to the field sync detection signal (SYNC).

Although FIGS. 13A and 13B illustrate two types of field sync detectors 251, this is merely an example and the detailed constitution of the field sync detector 251 may be changed according to circumstances.

FIGS. 14A and 14B are views illustrating search algorithms according to an exemplary embodiment of the present invention.

As shown in FIG. 14A, it is determined whether the transport stream after demodulation and equalization includes an additional data stream or not. As shown in FIG. 14B, it is also determined whether the transport stream after decoding includes an additional data stream or not. The respective case was described above and detailed description will be omitted.

Figure 15:
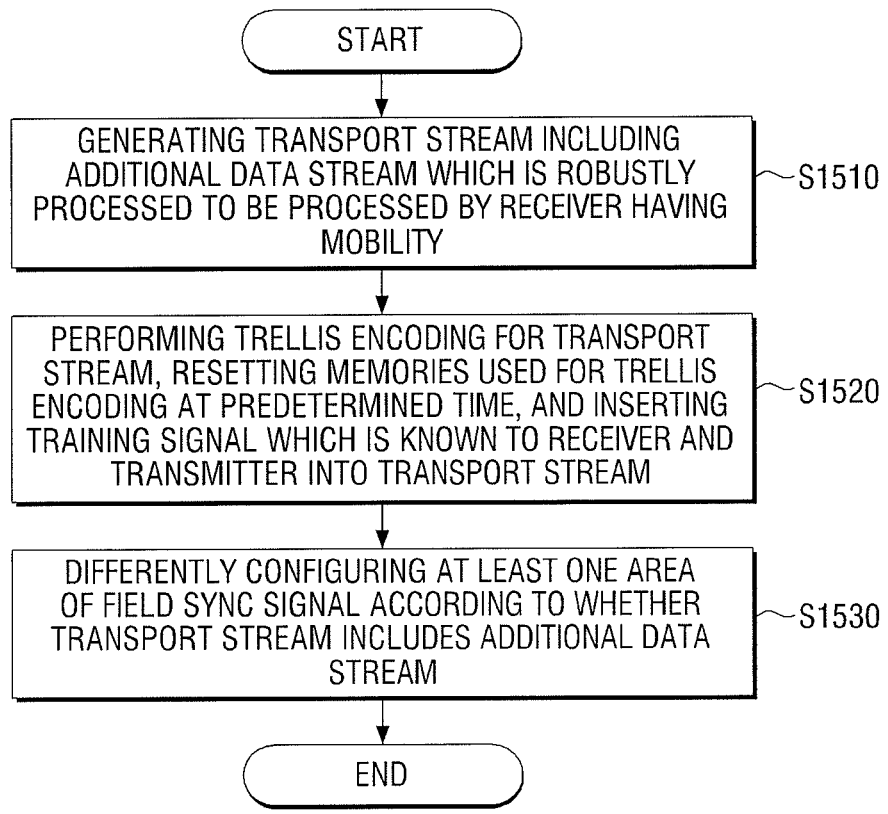
FIG. 15 is a flowchart outlining a method for processing streams of a digital broadcast transmitter consistent with an exemplary embodiment of the present invention.

FIG. 15 is a flowchart outlining a method for processing streams in a digital broadcast transmitter according to an exemplary embodiment of the present invention.

Referring to FIG. 15, a transport stream including an additional data stream, which has been processed to be robust so as to be processed by a receiver having mobility, is generated (S1510).

Trellis encoding is performed for the transport stream, memories used for trellis encoding are reset at predetermined time, and a training signal known to a transmitter and a receiver is inserted into the transport stream (S1520). The training signal inserted is used to determine whether the transport stream received at the receiver includes the additional data stream or not. Also, the training signal is used in demodulation or equalization at the receiver to improve receiving performance. Herein, the training signal is larger than a field sync signal and is inserted at two-segment intervals. That is, the training signal may be a long training symbol, and for example, is of a size of 1424 symbols.

According to whether the transport stream includes the additional data stream or not, at least one area of the field sync signal of the transport stream is differently configured (S1530).

For example, according to whether the transport stream includes the additional data stream or not, a property code of the field sync signal is set to have a different value. For example, if the transport stream includes the additional data stream, the property code of the field sync signal is set to '1', and otherwise, the property code is set to '0'. However, this is merely an example and the set value may change according to diverse embodiments. In this case, the receiver determines whether the transport stream includes the additional data stream or not based on the property code value.

Also, according to whether the transport stream includes the additional data stream or not, whether to insert a PN code into a predetermined symbol of the field sync signal is determined. For example, if the transport stream includes the additional data stream, a PN code is inserted into the 82 symbols of the 104 symbols in the reserved area, except for the property code area (10 symbols) and the precode area (12 symbols). In this case, the receiver determines whether the transport stream includes the additional data stream or not using the PN correlation value.

Also, according to whether the transport stream includes the additional data stream or not, whether to perform FEC coding with respect to a predetermined symbol of the field sync signal is determined. For example, if the transport stream includes the additional data stream, FEC coding is performed with respect to the 77 symbols of the 104 symbols in the reserved area, except for the property code area (10 symbols), the precode area (12 symbols), and the 5 reserved symbols. In this case, the receiver determines whether the transport stream includes the additional data stream or not by decoding the symbols.

Figure 16:
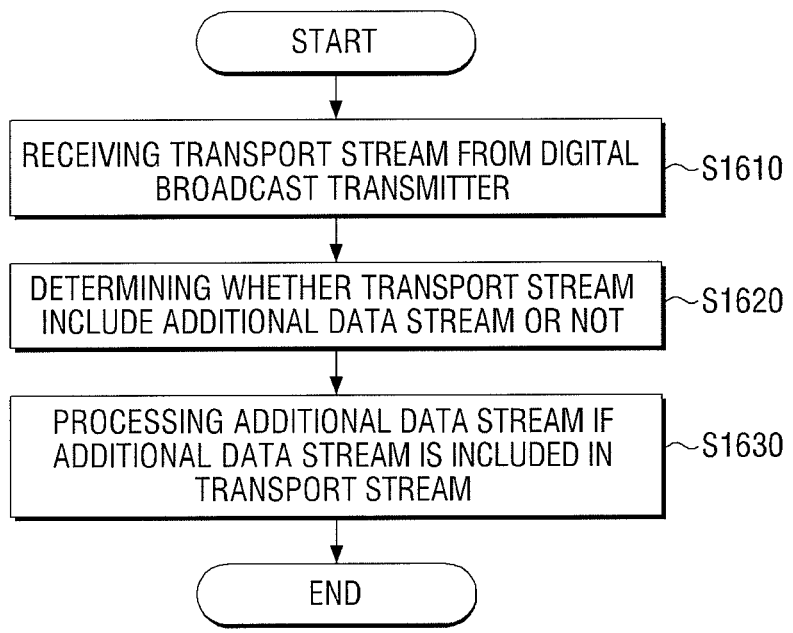
FIG. 16 is a flowchart outlining a method for detecting an additional data stream consistent with an exemplary embodiment of the present invention.

FIG. 16 is a flowchart outlining a method for detecting an additional data stream according to an exemplary embodiment of the present invention.

Referring to FIG. 16, if the digital broadcast receiver receives a transport stream (S1610), it is determined whether the transport stream includes an additional data stream or not (S1620). If the transport stream includes the additional data stream, a channel indicator may be generated.

If the transport stream is determined to include the additional data stream in operation S1620, the additional data stream is processed (S1630).

In operation S1620, the presence or absence of the additional data stream is determined based on a field sync signal, a training signal, or decoding data for example.

More specifically, in operation S1620, the presence or absence of the additional data stream is determined based on a property code value of the field sync signal. For example, if the property code area (or company code) of the field sync signal is set to '1', it is determined that the transport stream includes the additional data stream.

Also, in operation S1620, it is determined whether the transport stream includes the additional data stream using a correlation value of the PN code inserted into a predetermined symbol of the field sync signal. For example, if the transport stream includes the additional data stream, the PN code is inserted into the 82 symbols of the 104 symbols in the reserved area, except for the property code area (10 symbols) and the precode area (12 symbols). Accordingly, if the PN code is inserted, the additional data detector 250 detects that the transport stream includes the additional data stream.

Also, in operation S1620, the presence or absence of the additional data stream is determined according to whether FEC coding is performed with respect to a predetermined symbol of the field sync signal. For example, if the transport stream includes the additional data stream, the FEC coding is performed with respect to the 77 symbols of the 104 symbols in the reserved area, except for the property code area (10 symbols), the precode area (10 symbols), and the 5 reserved symbols. Accordingly, if the FEC coding is performed, the additional data detector 250 determines that the transport stream includes the additional data stream.

Also, in operation S1620, the presence or absence of the additional data stream is determined according to whether a training signal is inserted into the transport stream. For example, if the training signal is inserted into the transport stream, it is determined that the transport stream includes the additional data stream.

Also, in operation S1620, the presence or absence of the additional data stream is determined whether there is an error in the decoded data. For example, if there is no error in the decoded data, it is determined that the transport stream includes the additional data stream.

Accordingly, since the receiver can rapidly detect whether the transport stream received through a current channel includes the additional data stream or not, the time taken to search for the whole channels can be reduced. Also, since the search is made except for the channel allocated to already known different area, the time taken to search for channels can be reduced.

The foregoing exemplary embodiments and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A digital broadcast receiver comprising:
   a receiver which receives a transport stream transmitted from a digital broadcast transmitter;
   an additional data stream detector which determines whether the received transport stream includes an additional data stream with an additional error correction coding; and
   a processor which processes the additional data stream if the transport stream includes the additional data stream,
   wherein if the transport stream includes the additional data stream, the transport stream includes a training signal which resets memories used for trellis-encoding at a predetermined time, and
   wherein the additional data stream detector determines whether the transport stream includes the additional data stream according to whether forward error correction (FEC) coding is performed with respect to a predetermined symbol of the field sync signal.

2. The digital broadcast receiver as claimed in claim 1, further comprising:

a demodulator which demodulates the received transport stream; and an equalizer which equalizes the demodulated transport stream, wherein the additional data stream detector determines whether at least one of the demodulated transport stream and the equalized transport stream includes the additional data stream.

3. The digital broadcast receiver as claimed in claim 2, further comprising a decoder which decodes the equalized transport stream to generate decoded data, wherein the additional data stream detector determines whether the transport stream includes the additional data stream according to whether there is an error in the decoded data.

4. The digital broadcast receiver as claimed in claim 1, wherein the additional data stream detector determines whether the transport stream includes the additional data stream according to a property code value of the field sync signal.

5. The digital broadcast receiver as claimed in claim 1, wherein the additional data stream detector determines whether the transport stream includes the additional data stream using a correlation value of a pseudo noise (PN) code inserted into a predetermined symbol of the field sync signal.

6. The digital broadcast receiver as claimed in claim 1, wherein the additional data stream detector determines whether the transport stream includes the additional data stream according to whether the training signal is in the transport stream.

7. The digital broadcast receiver as claimed in claim 1, wherein the additional data stream detector generates a channel indicator if the transport stream is determined to include the additional data stream.

8. The digital broadcast receiver as claimed in claim 1, wherein the training signal is in a data area of the transport stream and is larger than the field sync signal.

9. A stream processing method of a digital broadcast receiver, the method comprising:

receiving a transport stream transmitted from a digital broadcast transmitter;

determining whether the received transport stream includes an additional data stream with an additional error correction coding; and processing the additional data stream if the transport stream includes the additional data stream, wherein if the transport stream includes the additional data stream, the transport stream includes a training signal which resets memories used for trellis-encoding at predetermined time, and wherein the determining comprises determining whether the transport stream includes the additional data stream according to whether forward error correction (FEC) coding is performed with respect to a predetermined symbol of the field sync signal.

10. The stream processing method as claimed in claim 9, further comprising:

demodulating the received transport stream; and equalizing the demodulated transport stream, wherein the determining step determines whether at least one of the demodulated transport stream and the equalized transport stream include the additional data stream.

11. The stream processing method as claimed in claim 10, further comprising decoding the equalized transport stream to generate decoded data, wherein the determining step determines whether the transport stream includes the additional data stream according to whether there is an error in the decoded data.

12. The stream processing method as claimed in claim 9, wherein the determining step determines whether the transport stream includes the additional data stream according to a property code value of the field sync signal.

13. The stream processing method as claimed in claim 9, wherein the determining step determines whether the transport stream includes the additional data stream using a correlation value of a pseudo noise (PN) code inserted into a predetermined symbol of the field sync signal.

14. The stream processing method as claimed in claim 9, wherein the determining step determines whether the transport stream includes the additional data stream according to whether the training signal is in the transport stream.

15. The stream processing method as claimed in claim 9, further comprising, if the transport stream is determined to include the additional data stream, generating a channel indicator.

16. The stream processing method as claimed in claim 9, wherein the training signal is in a data area of the transport stream and is larger than the field sync signal.

* * * * *